(12) United States Patent
Wang et al.

(10) Patent No.: US 8,977,387 B2
(45) Date of Patent: Mar. 10, 2015

(54) SYSTEM AND METHOD FOR OVERHEAD CROSS-SYSTEM TRANSPORTATION

(75) Inventors: Wei-Cheng Wang, Jongli (TW); Feng-Ning Lee, Taoyuan County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 1331 days.

(21) Appl. No.: 12/764,493

(22) Filed: Apr. 21, 2010

(65) Prior Publication Data

US 2011/0106300 A1    May 5, 2011

Related U.S. Application Data

(60) Provisional application No. 61/256,120, filed on Oct. 29, 2009.

(51) Int. Cl.
*G06F 7/00* (2006.01)
*H01L 21/677* (2006.01)

(52) U.S. Cl.
CPC .............................. *H01L 21/67733* (2013.01)

USPC ............ 700/228; 700/229; 700/230; 700/213

(58) Field of Classification Search
None
See application file for complete search history.

(56) References Cited

U.S. PATENT DOCUMENTS

| | | | |
|---|---|---|---|
| 2003/0202867 A1* | 10/2003 | Chang et al. ................ | 414/217.1 |
| 2007/0284217 A1* | 12/2007 | Ito .............................. | 198/346.2 |
| 2008/0281456 A1* | 11/2008 | Chen et al. .................... | 700/113 |
| 2009/0022575 A1* | 1/2009 | Tsuge .......................... | 414/679 |
| 2009/0288931 A1* | 11/2009 | Oshima ........................ | 198/607 |
| 2009/0297299 A1* | 12/2009 | Campbell et al. ........... | 414/217.1 |
| 2010/0138016 A1* | 6/2010 | Chen et al. ...................... | 700/96 |

* cited by examiner

*Primary Examiner* — Yolanda Cumbess
(74) *Attorney, Agent, or Firm* — Lowe Hauptman & Ham, LLP

(57) ABSTRACT

A system for managing semiconductor production includes a conveyor to convey a wafer carrier to or from an overhead hoist transfer system. The system also includes a cross-system transport apparatus to transfer the wafer carrier between the conveyor and an overhead shuttle system.

24 Claims, 6 Drawing Sheets

SYSTEM AND METHOD FOR OVERHEAD CROSS-SYSTEM TRANSPORTATION

CROSS-REFERENCE TO RELATED APPLICATIONS

The present application claims priority of U.S. Provisional Patent Application Ser. No. 61/256,120, filed on Oct. 29, 2009, which is incorporated herein by reference in its entirety.

BACKGROUND

In modern semiconductor fabrication facilities, overhead shuttle (OHS) systems and overhead hoist transport (OHT) systems are extensively used to automate the wafer transport process. The OHS is a transport mechanism suitable for long distance interbay transport and the OHT is suitable for short distance intrabay transport. Based on dispatching need and by the instruction of an automated material handling system (AMHS), a stocker can store wafer carriers for the OHS and the OHT before the wafer carriers are further transported. A wafer carrier may move within the same transport system, or the wafer carrier may be routed from the OHS to the OHT or vice versa. For cross-system transportation between the OHS and the OHT, a robot inside the stocker is configured to transfer the wafer carrier from one transport system to the other.

Although the robot inside the stocker performs cross-system transportation between the OHS and the OHT, the robot is also used to transfer wafer carriers between the stocker and either the OHS or the OHT if the movement of wafer carriers is within the same transport system. The robot inside the stocker serves both the needs of single-system transportation and cross-system transportation. Therefore, the robot may be overloaded and cause traffic congestion in times of heavy traffic. In addition, regarding space utilization, the stocker will occupy the shop floor of a semiconductor manufacturing facility for storage of wafer carriers. The shop floor in a clean room of the semiconductor manufacturing facility is valuable and limited.

The dual roles of the robot to facilitate the storage function of a stocker for the same transport system and to perform cross-system transportation make the robot a potential bottleneck of the overall transportation of wafer carriers. The stocker and the robot might not meet the expectation of lean operation in semiconductor fabrication facilities. In addition, if the stocker is used solely for cross-system transportation, the shop floor occupied by the stocker would be less cost effective.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
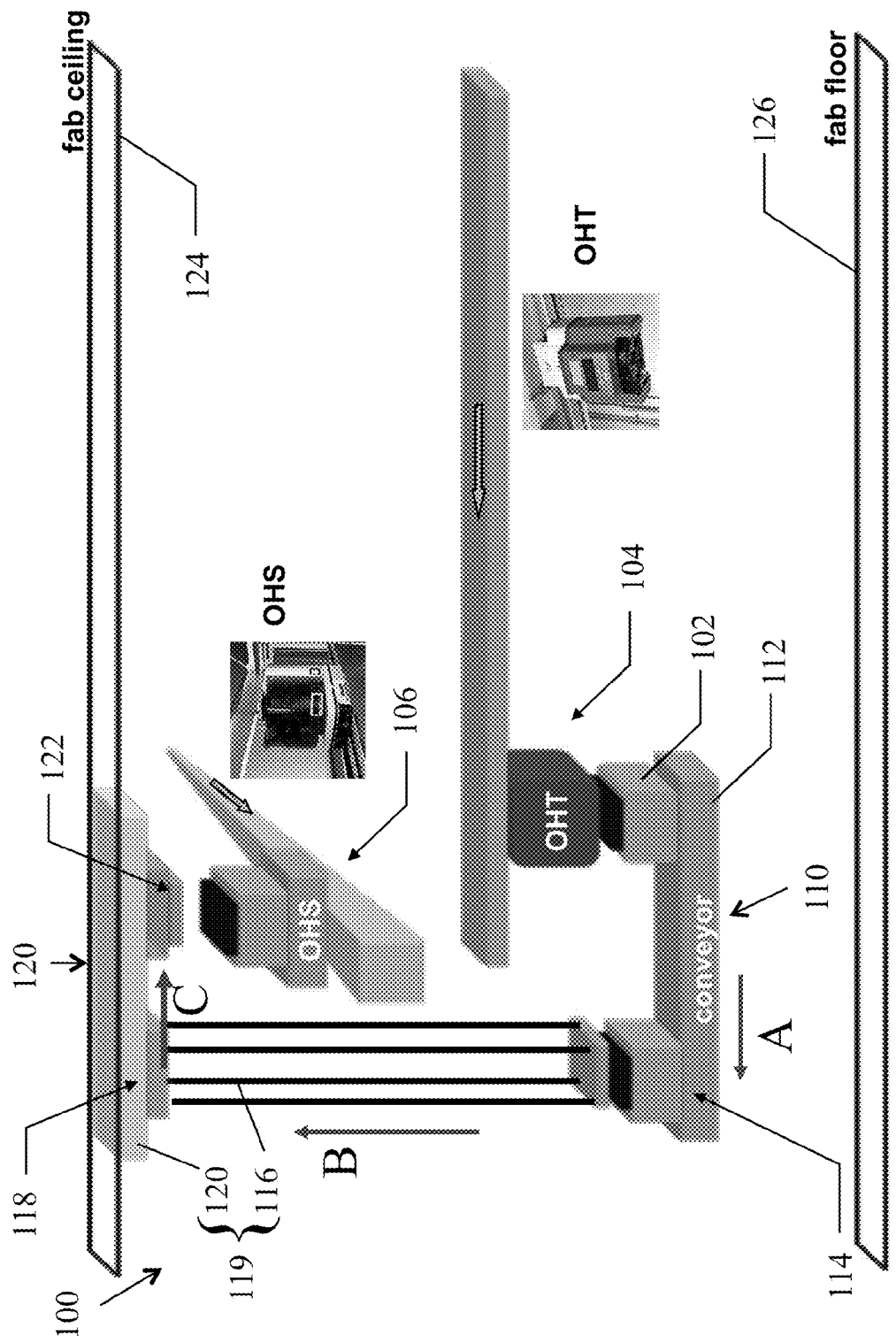
FIG. 1 is a schematic, perspective view of a cross-system transport according to an embodiment.

FIG. 1 depicts a view of an overhead cross-system transport 100 according to an embodiment. Transport 100 includes a conveyor 110 and a cross-system transport apparatus (generally indicated by reference numeral 119), and transfers a wafer carrier 102 between an overhead transport (OHT) system 104 and an overhead shuttle (OHS) system 106. Wafer carrier 102 is a front-opening unified pod (FOUP) for carrying wafers. In at least some embodiments, wafer carrier 102 may be configured to transport a plurality of wafers, e.g., 6 wafers, 12 wafers, 24 wafers, etc. In at least some embodiments, wafer carrier 102 may comprise different FOUP sizes such as 300 millimeter (mm) or 450 mm. Other types and/or sizes of wafer carrier or pod are, however, not excluded.

OHT 104 operates to vertically load and unload a wafer carrier to/from a material handling and/or a processing machine (not shown). For example in FIG. 1, the OHT 104 has a wafer carrier 102 that is being vertically transported to conveyor 110. The OHT 104 unloads or places the wafer carrier 102 to a loading station (generally indicated by reference numeral 112) of the conveyor 110. In another example, OHT 104 picks the wafer carrier 102 from station 112 which, in that case, is an unloading station of conveyor 110.

In at least some embodiments, the OHT 104 hangs suspended from the ceiling 124. OHT 104 is equipped with a gripper that can grasp the top flange of the wafer carrier 102. To transfer the wafer carrier 102 to a process tool, the gripper is lowered down to the load port of the tool and then places the wafer carrier 102 on the load port.

Conveyor 110 extends in a generally horizontal direction from left to right across the page. Conveyor 110 comprises first loading/unloading station 112 at one end and a first operating position (generally indicated by reference numeral 114) at another end of the conveyor. In at least some embodiments, one or the other or both of first loading/unloading station 112 or first operating position 114 may be positioned at a portion of conveyor 110 other than an end. Conveyor 110 may be hung from ceiling 124 or another object able to support the weight of conveyor 110.

Conveyor 110 is arranged to transport wafer carrier 102 in a horizontal direction (generally indicated by reference character A) between first loading/unloading station 112 and first operating position 114 for interaction with cross-system transport apparatus 119. In at least some embodiments, conveyor 110 comprises a belt-based system, e.g., a conveyor belt. In at least some other embodiments, conveyor 110 comprises a transport mechanism for transporting a received wafer carrier in a horizontal direction. In at least some other embodiments, conveyor 110 comprises a transport mechanism for transporting a received wafer carrier in a vertical or partially vertical direction. In at least some other embodiments, conveyor 110 comprises a different transport mechanism such as rollers, a movable arm, etc.

Cross-system transport apparatus 119 in the specifically illustrated configuration includes a hoist 116 and a slide table 120. Conveyor 110 conveys the wafer carrier 102 to the first operating position 114 for hoist 116 to grasp and raise the wafer carrier 102 to a second operating position (generally indicated by reference numeral 118) of slide table 120.

The hoist 116 comprises at least one, e.g., 4, sets of belt and pulley mechanism, gripper, and motor driver that can rotate the belt and pulley mechanism to raise and lower down the gripper. In some embodiments, the gripper of hoist 116 is similar that of OHT 104 to grasp the top flange of the wafer carrier 102. The slide table 120 comprises a set of a linear guide, a ball screw, and a motor. The slide table 120 provides at least one degree of linear motion (forward and backward).

On the slide table 120, the hoist 116 is slideable to a second unloading/loading station (generally indicated by reference numeral 122) and arranged to unload/load the wafer carrier 102 to/from the OHS 106.

The OHS 106 comprises a set of tracks, one or more shuttle-type vehicles, and a vehicle control system. The OHS 106 is arranged to transport a wafer carrier 102 on a stage of the vehicle. The OHS 106 transports wafer carriers between stockers (from one stocker to another stocker). When the OHS 106 arrives at the load/unload station of stockers, the wafer carrier 102 will be picked by the arm of stockers and stored inside the stockers.

In addition, the slide table 120 is attached to the ceiling 124 in a semiconductor manufacturing facility. In at least some embodiments, slide table 120 is suspended from the ceiling or an intermediate member attached to the ceiling. In at least some embodiments, the cross-system transport 100 does not occupy any space of floor 126 in the manufacturing facility. In at least some other embodiments, the cross-system transport 100 occupies less floor space than a stocker.

Figure 2:
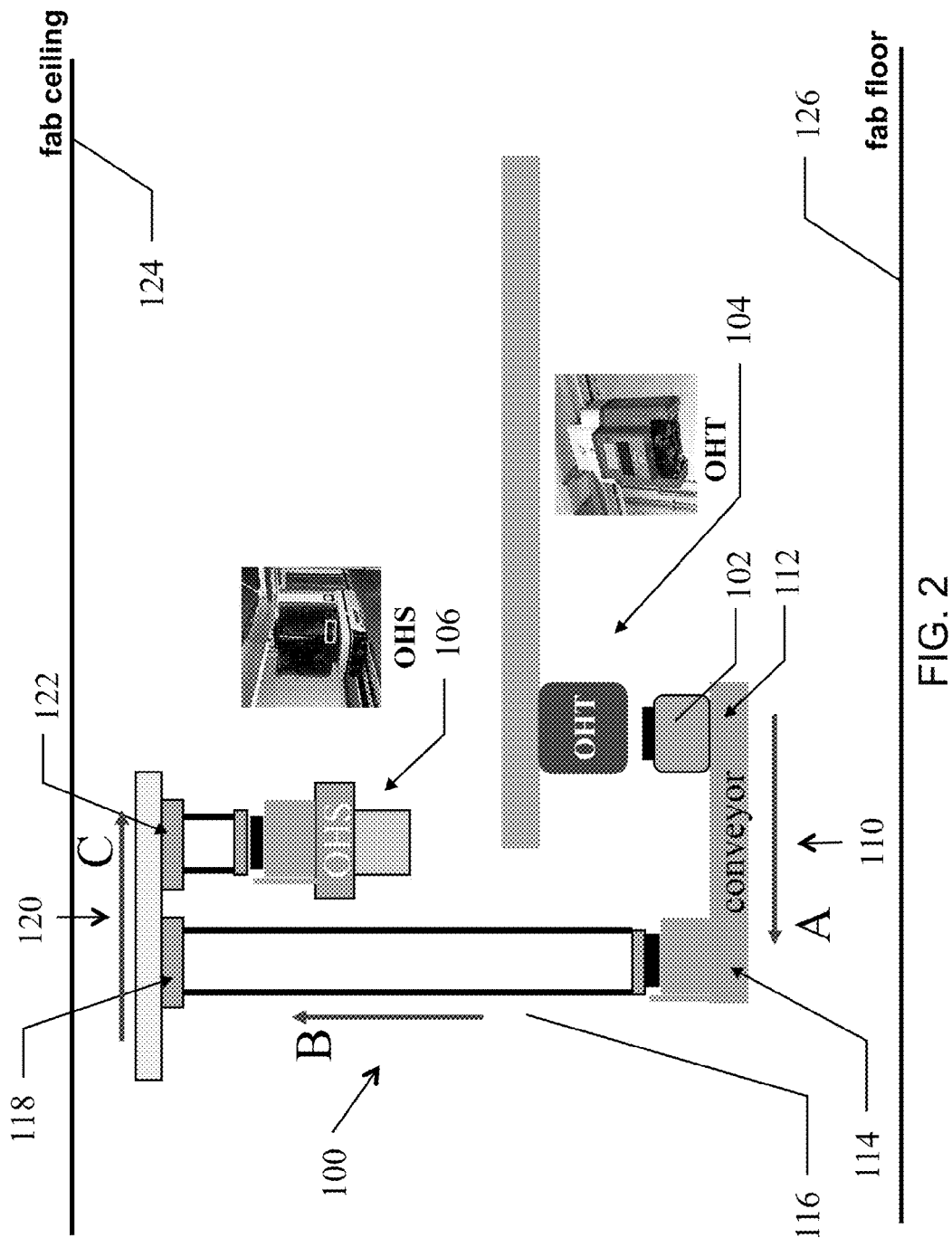
FIG. 2 is a schematic, side view of the FIG. 1 embodiment.

FIG. 2 depicts a side view of the FIG. 1 embodiment. In operation according to at least one embodiment, the wafer carrier 102 is unloaded from OHT 104, e.g., by placement or lowering onto the conveyor 110, moved from first loading/unloading station 112 to first operating position 114 by the conveyor 110 (in a horizontal direction indicated by reference character A), hoisted by the hoist 116 (in a vertical direction indicated by reference character B), then slid on the slide table 120 from the second operating position 118 to the second unloading/loading station 122 (in a horizontal direction indicated by reference character C) and placed on a vehicle of OHS 106. According to at least another embodiment (not shown in FIG. 2), the wafer carrier 102 is transported in the opposite direction from the OHS 106 to the OHT 104 in a manner similar to a cross-system transport 300 that will be description herein with respect to FIG. 3. In at least another embodiment, cross-system transport 100 is configured to selectively transport the wafer carrier 102 from the OHS 106 to the OHT 104 or from the OHT 104 to the OHS 106.

Figure 3:
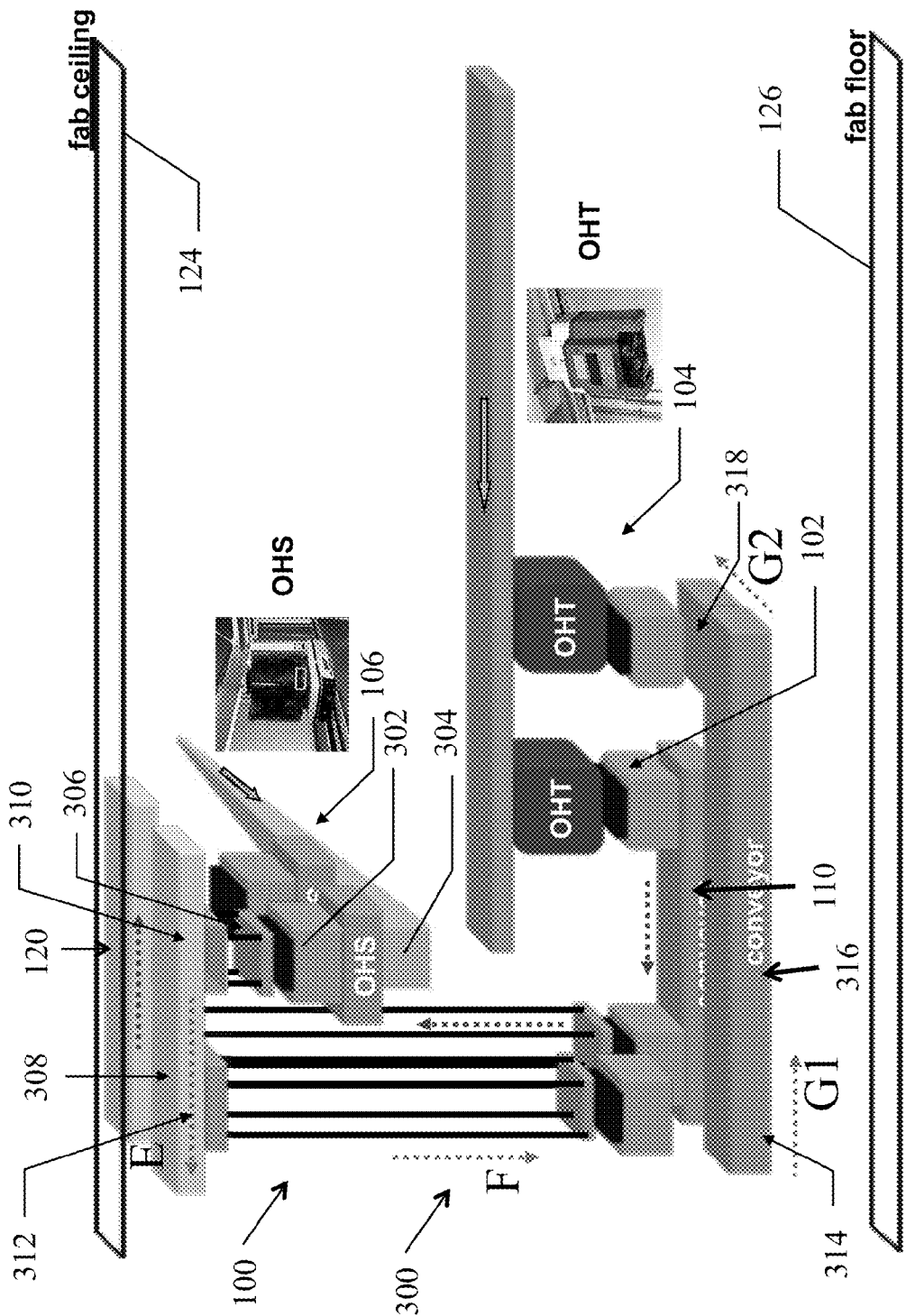
FIG. 3 is a schematic, perspective view of a cross-system transport for bidirectional transportation according to another embodiment.

FIG. 3 depicts two-way transportation of wafer carriers between OHT 104 and OHS 106 by a first cross-system transport 100 and a second cross-system transport 300. In at least one embodiment, the moving direction of the transport 100 is opposite to the moving direction of the transport 300. In at least some embodiments, the moving direction of the transport 100 is the same as the moving direction of the transport 300. To execute a cross-system transportation from the OHS 106 to the OHT 104 through the transport 300, a wafer carrier 302 is prepared at stop station 304 of the OHS 106 for the hoist 306 to grasp the wafer carrier 302. Next, the hoist 306 along with the grasped wafer carrier 302 slides on the slide table 308 in a horizontal direction E and moves the wafer carrier 302 from loading position 310 to operating position 312. The hoist 306 lowers the wafer carrier 302 in a vertical direction F to the operating position 314 on an L-shaped conveyor 316. A purpose of the conveyor in at least one embodiment is to be the bridge between OHT 104 and the hoist 306 and, in some embodiments, to provide a buffering function. The L-shaped conveyor 316 is exemplary. The shape and height of the conveyor depends on the load/unload locations of OHT 104 and the location of the hoist 306. By using different conveyor belts, conveyor 316 moves the wafer carrier 302 in a horizontal direction G1 and rotates the wafer carrier 302 to a different direction G2, in at least some embodiments. The wafer carrier 302 is transported to loading position 318 for the OHT 104 to pick up and transfer the wafer carrier 302 to the appropriate handling or processing machine. Similar to transport 100 in at least some embodiments, the transport 300 does not occupy any space of floor 126 in the manufacturing facility.

Figure 4:
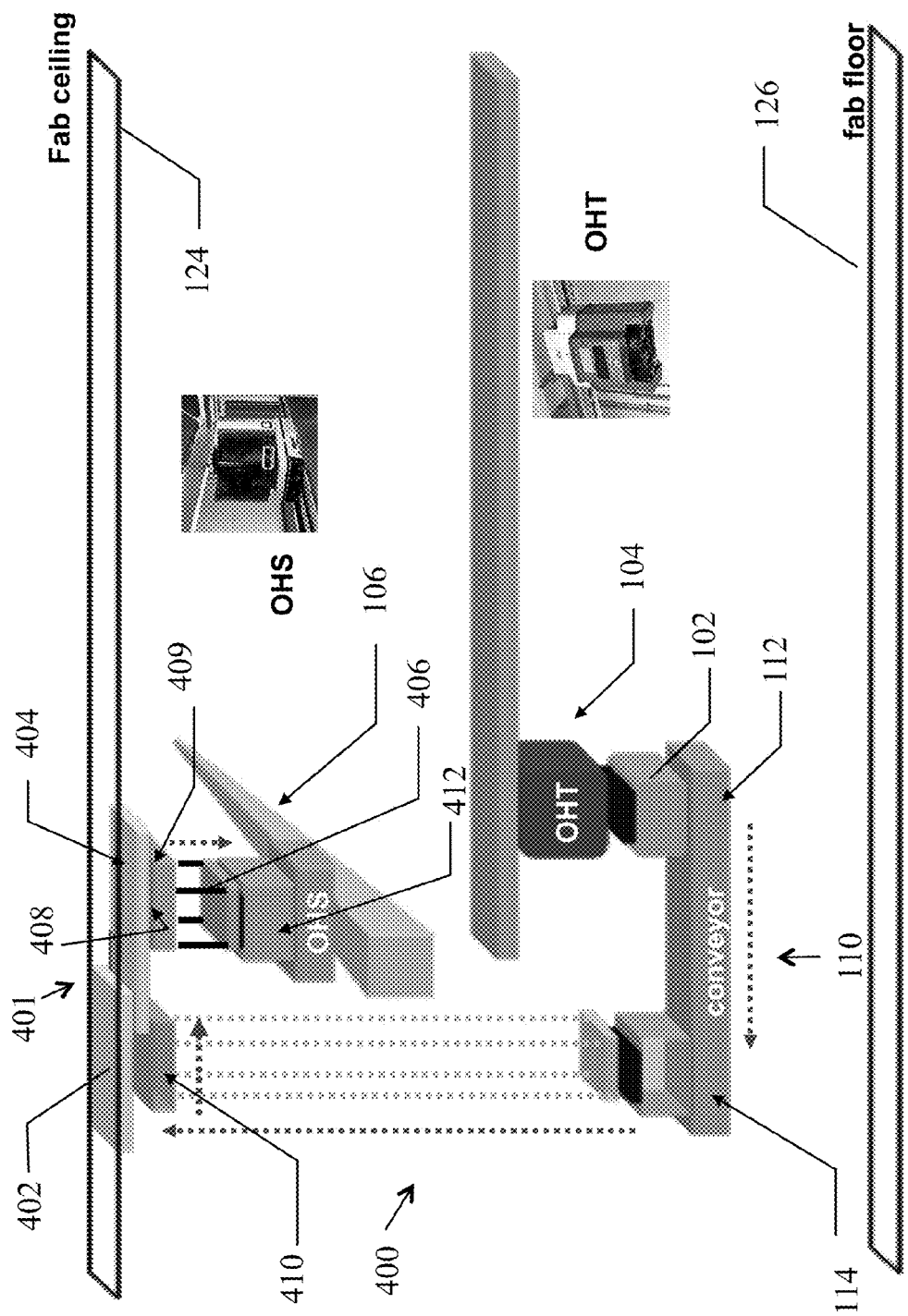
FIG. 4 is a schematic, perspective view of a cross-system transport comprising a slide fork according to another embodiment.

FIG. 4 depicts an overhead cross-system transport 400 according to another embodiment which comprises a slide fork 401 as part of its cross-system transport apparatus. The slide fork 401 includes a first slide table 402 (also referred to as an upper slide table) and a second slide table 404 (also referred to as a lower slide table). The first slide table 402 is attached to the ceiling 124 in a manufacturing facility and the second slide table 404 is slidably coupled with the first table 402. In at least some embodiments, first and second slide tables 402, 404 are coupled to be slideable with respect to each other in at least one direction. In at least some embodiments, first slide table 402 is attached to a device or mount positioned above OHS 106.

A hoist 406, similar to hoist 116, is attached to the second slide table 404 at a lower face of the second table (as indicated by reference arrow 408). During a sliding movement of the second slide table 404, the attached hoist 406 moves a grasped wafer carrier 412 horizontally between an OHS load/unload position 409 and a raise/lower position 410. At load/unload position 409, the hoist 406 alternately unloads the wafer carrier 412 to the OHS 106 or grasps and loads, by a gripper (not shown) similar to that of hoist 116, the wafer carrier 412 from the OHS 106 to slide fork 401. At raise/lower position 410, the hoist 406 lowers the wafer carrier 412 to the conveyor 110 or grasps the wafer carrier 412 from the conveyor 110. The slide fork 401 changes the horizontal movement of the hoist 406 without impacting the vertical operation of the cross-system transport 400. In at least some embodiments, the transport 400 does not occupy any floor space in the manufacturing facility. In at least some embodiments, the transport 400 minimizes the use of floor space in the manufacturing facility for cross-system transport.

Figure 5:
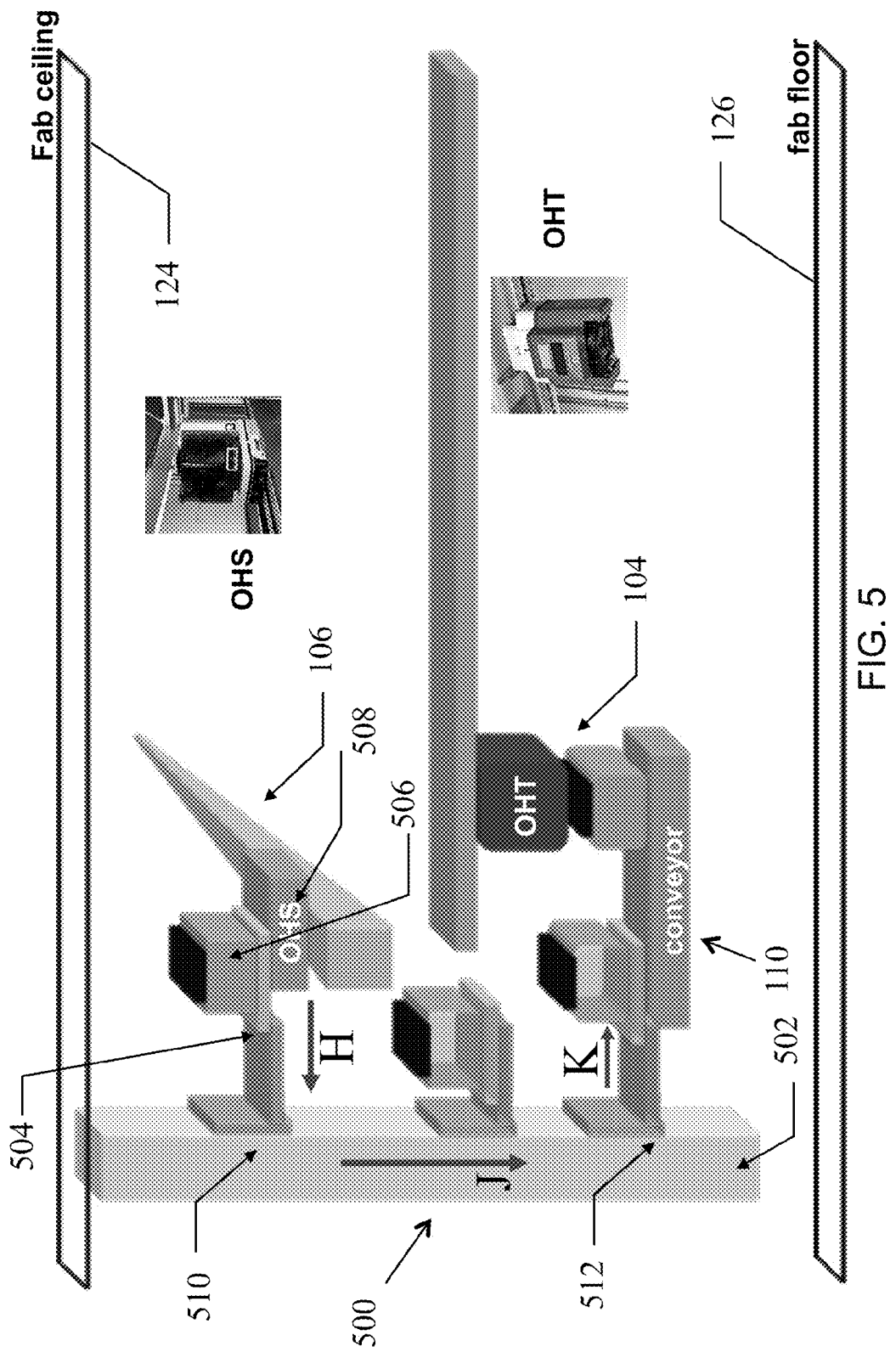
FIG. 5 is a schematic, perspective view of a cross-system transport comprising a crane and robot arm according to another embodiment.

FIG. 5 depicts a cross-system transport 500 comprising, as its cross-system transport apparatus, a crane 502 and a robot arm 504, according to another embodiment. The robot arm 504 is arranged to grasp a wafer carrier 506 from the OHS 106 or from the conveyor 110. Conversely, the robot arm 504 can unload the wafer carrier 506 to the OHS 106 or to the conveyor 110. In some embodiments, a clamp (not shown) is provided on the robot arm 504 to clasp the wafer carrier by the bottom surface of the wafer carrier as illustrated in FIG. 5. The robot arm 504 is attached to the crane 502 and movable vertically along the crane. Responsive to a request for a cross-system transportation, such as for transport of a wafer carrier from the OHS 106 to the OHT 104, the robot arm 504 grasps the wafer carrier 506 from a load/unload position 508 (similar to load/unload position 409 (FIG. 4)), moves the wafer carrier 506 in a horizontal direction H to a raise/lower position 510 (similar to raise/lower position 410 (FIG. 4)), lowers the wafer carrier 506 in a vertical direction J to a conveyor load/unload position 512, then moves the wafer carrier 506 in another horizontal direction K and unloads the wafer carrier 506 to the conveyor 110 for further transport as described above.

Figure 6:
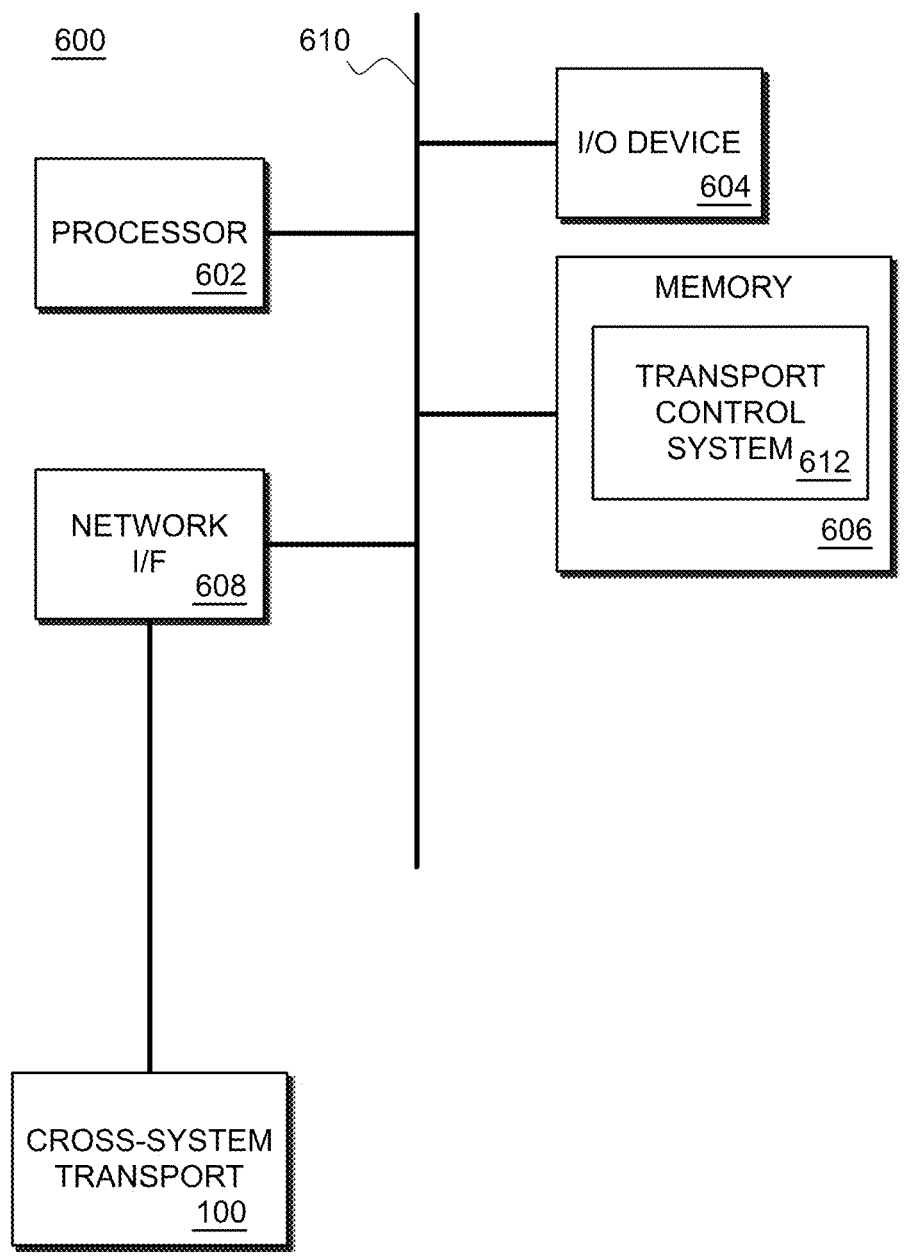
FIG. 6 is a high-level functional block diagram of a controller system according to an embodiment.

FIG. 6 depicts a high-level block diagram of a controller system 600 (also referred to as a controller) in accordance with an embodiment. Controller 600 generates output control signals for controlling operation of one or more components of one or more cross-system transport such as 100, 300, 400, 500 in accordance with at least one embodiment (only cross-system transport 100 is shown in FIG. 6 for illustrative purposes). Controller 600 receives input signals from one or more components (e.g., conveyor 110 and/or cross-system transport apparatus 119) of cross-system transport 100 and/or OHS 106 and/or OHT 104 and/or an automated material handling system (AMHS) in accordance with at least one embodiment. In at least some embodiments, controller system 600 is located adjacent cross-system transport 100. In at least some further embodiments, controller system 600 is integrated as a component of cross-system transport 100. In at least some other embodiments, controller system 600 is remote from cross-system transport 100.

Controller system 600 comprises a processor 602, an input/output (I/O) device 604, a memory 606, and a network interface (I/F) 608 each communicatively coupled via a bus 610 or other interconnection communication mechanism.

Processor 602 may comprise a processor, a microprocessor, a controller, or other device such as an application-specific integrated circuit (ASIC) arranged to execute and/or interpret one or more sets of instructions, e.g., a transport control system 612 stored in memory 606.

I/O device 604 may comprise an input device, an output device, and/or a combined input/output device for enabling user interaction. An input device may comprise a mechanism for communicating at least a command to processor 602. In at least some embodiments, input/output device 604 may comprise a serial and/or parallel connection mechanism.

Memory 606 (also referred to as a computer-readable medium) may comprise a random access memory or other dynamic storage device, communicatively coupled to bus 610 for storing data and/or instructions for execution by processor 602. Memory 606 also may be used for storing temporary variables or other intermediate information during execution of instructions to be executed by processor 602. Memory 606 may also comprise a read-only memory or other static storage device coupled to the bus 610 for storing static information and instructions for processor 602.

Memory 606 stores a transport control system 612 (a set of executable instructions) for controlling one or more components of cross-system transport 100. In some other embodiments, the transport control system 612 is implemented as a hard-wired circuit and integrated into the processor 602.

Network interface 608 comprises a mechanism for connecting to a network. In at least some embodiments, network interface 608 may comprise a wired and/or wireless connection mechanism. In at least some embodiments, controller system 600 is coupled with one or more components of cross-system transport 100 via network interface 608, as depicted. In at least some other embodiments, controller system 600 is directly coupled with one or more components of cross-system transport 100, e.g., with the components coupled to bus 610 instead of via network interface 608.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A system for managing semiconductor production, the system comprising:
   a conveyor to convey a wafer carrier to or from an overhead hoist transfer (OHT) system;
   a cross-system transport apparatus to transfer the wafer carrier between the conveyor and an overhead shuttle (OHS) system; and
   a controller configured to output control signals to control at least one of the cross-system transport apparatus, the conveyor, and the loading or unloading of the wafer carrier at the OHT or the OHS,
   wherein the cross-system transport apparatus comprises a lifting device configured to raise or lower the wafer carrier.

2. The system according to claim 1, wherein the cross-system transport apparatus occupies zero floor space within a semiconductor manufacturing facility.

3. The system according to claim 1, wherein the cross-system transport apparatus further comprises:
   an overhead transport, and
   the lifting device comprises:
   a hoist coupled to and moveable along the overhead transport, the hoist being configured to raise or lower the wafer carrier between the conveyor and the overhead transport and the hoist being configured to grip and release the wafer carrier located at the conveyor or at the OHS.

4. The system according to claim 3, wherein said wafer carrier has a top flange adapted to be clasped by the OHT and wherein the hoist is also configured to clasp said wafer carrier by the top flange.

5. The system according to claim 1, wherein the cross-system transport apparatus further comprises:
   an upper slide table; and
   a lower slide table coupled to and slidable relative to the upper slide table to define a slide fork; and
   the lifting device comprises:
   a hoist attached to the lower slide table of the slide fork, the hoist being configured to raise or lower the wafer carrier between the conveyor and the OHS via movements of the slide fork and the hoist being configured to grip and release the wafer carrier located at the conveyor or at the OHS.

6. The system according to claim 5, wherein said wafer carrier has a top flange adapted to be clasped by said OHT and wherein the hoist is also configured to clasp said wafer carrier by the top flange.

7. The system according to claim 1, wherein the lifting device comprises a crane, and the cross-system transport apparatus further comprises:
   a robot arm slidably coupled to the crane;
   the robot arm being configured to move the wafer carrier between the conveyor and the OHS.

8. The system according to claim 7, wherein the robot arm is configured to clamp onto the wafer carrier.

9. The system according to claim 8, wherein said wafer carrier has a bottom surface, and said robot arm is configured to clasp the wafer carrier by the bottom surface.

10. The system according to claim 1, further comprising the wafer carrier being a front-opening unified pod (FOUP).

11. The system according to claim 1, wherein the conveyor defines an area for buffering one or more said wafer carrier.

12. The system according to claim 1, wherein the conveyor is configured to rotate said wafer carrier to a different conveying direction.

13. The system according to claim 1, wherein the controller is configured to receive at least one transportation request of said wafer carrier from an automated material handling system (AMHS).

14. The system for managing semiconductor production of claim 1, wherein the OHS system has tracks.

15. The system for managing semiconductor production of claim 14, wherein the OHS further comprises at least one shuttle-type vehicle adapted to travel on the tracks.

16. The system for managing semiconductor production of claim 15, wherein the OHS further comprises a vehicle control system adapted to control the at least one shuttle-type vehicle.

17. The system for managing semiconductor production of claim 16, wherein the at least one shuttle-type vehicle further comprises a stage adapted to transport the wafer carrier.

18. A system for managing semiconductor production, the system comprising:
   a conveyor configured to move a wafer carrier to or from an overhead hoist transfer (OHT) system; and
   an overhead transfer apparatus comprising a lifting device configured to transfer said wafer carrier in at least an elevational manner between said conveyor and an overhead shuttle (OHS) system.

19. The system according to claim 18, where said overhead transfer apparatus includes a gripper configured to grab said wafer carrier.

20. The system according to claim 18, further comprising:
   a slide table configured to transfer said wafer carrier to or from said OHS.

21. A system for managing semiconductor production, the system comprising:
   a conveyor to convey a wafer carrier to or from an overhead hoist transfer (OHT) system;
   an overhead shuttle (OHS) system having tracks;
   a cross-system transport apparatus to transfer the wafer carrier between the conveyor and the OHS system; and
   a controller configured to output control signals to control at least one of the cross-system transport apparatus, the conveyor, and the loading or unloading of the wafer carrier at the OHT or the OHS,
   wherein the cross-system transport apparatus comprises a gripper configured to grab a top portion of the wafer carrier.

22. The system for managing semiconductor production of claim 21, wherein the OHS further comprises at least one shuttle-type vehicle adapted to travel on the tracks.

23. The system for managing semiconductor production of claim 22, wherein the OHS further comprises a vehicle control system adapted to control the at least one shuttle-type vehicle.

24. The system for managing semiconductor production of claim 23, wherein the at least one shuttle-type vehicle further comprises a stage adapted to transport the wafer carrier.

\* \* \* \* \*